United States Patent [19]
Smith

[11] Patent Number: 6,166,603
[45] Date of Patent: Dec. 26, 2000

[54] CLASS-AB OUTPUT STAGES WITH IMPROVED DISTORTION PERFORMANCE

[75] Inventor: Douglas L. Smith, Tucson, Ariz.

[73] Assignees: Maxim Integrated Products, Inc., Sunnyvale, Calif.; Gain Technology Corp., Tucson, Ariz.

[21] Appl. No.: 09/204,322

[22] Filed: Dec. 2, 1998

[51] Int. Cl.[7] ........................................ H03F 3/18
[52] U.S. Cl. ........................................... 330/263; 330/267
[58] Field of Search ................................ 330/263, 267, 330/268

[56] References Cited

FOREIGN PATENT DOCUMENTS

| 55-115706 | 9/1980 | Japan | 330/264 |
|---|---|---|---|
| 55-115708 | 9/1980 | Japan | 330/264 |
| 474905 | 11/1975 | U.S.S.R. | 330/263 |

*Primary Examiner*—Robert Pascal
*Assistant Examiner*—Henry Choe
*Attorney, Agent, or Firm*—Hickman Coleman & Hughes, LLP

[57] ABSTRACT

The present invention teaches output stages having distortion performance improved relative to prior art class-AB output stage distortion performance. The general concept is to constantly bias the feed-forward circuitry of the output stage into a low-distortion operating state. This can be done through several different methods, each of which has its own particular circuit requirements. For example, in one embodiment the bias circuitry generates a near constant bias current suitable for forcing the feed-forward circuitry into a low-distortion operating state regardless of the output stage output value.

18 Claims, 6 Drawing Sheets

(Prior Art Class-AB Output Stage)

(Prior Art Class-AB Output Stage)

CLASS-AB OUTPUT STAGES WITH IMPROVED DISTORTION PERFORMANCE

TECHNICAL FIELD

The present invention is related to electronic amplifier design. More specifically, the present invention contemplates an output stage having a buffer output circuit, a feed-forward control circuit, and a bias circuit. In application, this inventive concept yields, for example, improved distortion output stages of the class-AB variety.

BACKGROUND ART

The schematic of Prior Art FIG. 1 illustrates a 4-transistor emitter follower 100 including transistors Q1–Q4 and source and sink current devices I1 and I2. As will be appreciated, the emitter follower 100 provides many essential characteristics of a good output stage and therefore is commonly used as an output buffer stage in operational amplifiers. The emitter follower output current Ief is however limited by the product of the quiescent current of the current sources I1 and I2 and the current gain of the output transistor devices Q3 and Q4. This limitation can be particularly bothersome for high-speed complementary bipolar processes where beta PNP can be 20 or even lower, especially at cold temperatures.

The Prior Art teaches output buffer stages that are variations and improvements upon the emitter follower 100 of FIG. 1. For example, output current capability is often improved by adding another emitter follower stage, resulting in a "triple" buffer that provides higher output current at the expense of reduced voltage swing and increased quiescent current requirements. The reduced voltage swing is usually unacceptable for amplifiers that must operate from supplies of 5 volts or less.

The Prior Art also suggests that the output current capability of the 4-transistor buffer 100 may be improved by applying the output emitter follower collector currents to the inputs of current mirrors with outputs in parallel with the buffer output. This output stage can provide additional output current in direct proportion to the current mirror gain. However, additional quiescent current equal to the product of buffer output device quiescent current and current mirror gain is required.

The schematic of Prior Art FIG. 2 illustrates one class-AB output stage 150 that is a common variation upon the emitter follower 100 of FIG. 1. The output stage 150 includes a complementary 4-transistor emitter follower 100, common emitter transistor devices Q5 and Q6, and source and sink current devices I3 and I4. The class-AB output stage 150 provides improved output current capability but increases the required quiescent current and sacrifices output voltage swing capability.

The output stage 150 of FIG. 2 operates as follows. Current sources I3 and I4 source and sink, respectively, the quiescent current of the emitter follower devices Q3 and Q4 and provide the quiescent base current for common emitter output devices QS and Q6. All of the signal current in the collectors of the emitter follower devices Q3 and Q4 is available to drive the bases of the common emitter output devices Q5 and Q6. In essence, the common emitter output devices Q5 and Q6 are providing feed-forward current at the output.

In practice, the output stage 150 is non-functional. Temperature and device variations bring about intolerable swings in the quiescent current of common emitter output device Q5 and Q6. A means for controlling the quiescent current of the common emitter output devices that does not limit the signal current gain is required.

Prior Art FIG. 3 illustrates an output circuit 200 that provides control of the common emitter output devices in a manner that does not limit the signal current gain. Unfortunately, as will be described, the output circuit 200 has poor distortion characteristics. The output circuit 200 includes a class-AB output stage 150, parallel connected drivers Q10 and Q13, and a complementary pair of constant current transistors Q9 and Q14 that are operated as current mirrors together with transistors Q7, Q8, Q11, and Q12. The current mirror inputs are obtained from a relatively low current source/sink IREF. The transistor sizes are chosen so that the output pair quiescent current is the desired multiple of current mirror inputs. The constant current transistors Q9 and Q14 also source and sink the collector current of the emitter follower output devices Q3 and Q4, acting as equivalents of current sources I3 and I4 of FIG. 2.

Operation of the output circuit 200 may be more fully understood after reflecting upon the following. Consider a positive going signal applied to the input at VIN which results in sourcing output current to a load connected to VOUT. As load current begins to flow, the current through Q3 increases while current through Q4 decreases. The increasing current entering the collector of Q3 decreases the potential at the base of Q5 resulting in increased Q5 current which adds to the total current sourced to the load. The decreasing potential at the base of Q5 results in decreasing current in Q10. This reinforces the reduced current in Q4 resulting in lower potential at the base of common emitter output device Q6. The collector current in Q6 is reduced, further enhancing the net sourcing of current to the load. Note that the reduced potential at the base of Q6 also results in increased current in Q13, further reinforcing the net current sourcing action of the circuit.

Thus the output circuit 200 is capable of providing high output current drive, but only when the beta current multiplier of transistor Q5 is fully utilized. This means that Q3 must have a full current load. For the transistor Q3 to have a full current load, Q9 must be operating as a near perfect current source. For transistor Q9 to operate as a near perfect current source, transistor Q10 must transition from an ON to an OFF state. Any modulation of Q10 causes distortion in the output signal, but the ON/OFF transition perhaps the most. Therefore, the output circuit 200 provides high current gain for the cost of distortion.

Prior Art FIG. 4 schematically illustrates an output circuit 250 including a buffer output circuit 252 and a feed-forward control circuit 254. Reflecting upon the output circuits of FIGS. 1–3, those skilled in the art will recognize a pattern arising. The 4-transistor common emitter follower circuit 100 is utilized as a buffer output circuit and the improvement circuits added in FIGS. 2 and 3 are feed-forward control circuits intended to address the deficiencies of the buffer output circuit 100. Prior Art FIG. 4 illustrates one block diagram model for an output circuit having both buffering and feed-forward control. For example, in the output circuit 150 of FIG. 2, the transistor devices Q5 and Q6 feed-forward and make available additional current at the output Vout. The output circuit 200 of FIG. 3 provides a crude controller compensating for the lack of control over quiescent current within the output circuit 150.

What is needed is a proper biasing of the feed-forward circuitry that does not result in poor circuit distortion characteristics.

DISCLOSURE OF THE INVENTION

The present invention teaches output stages having distortion performance improved relative to prior art class-AB output stage distortion performance. The general concept is to constantly bias the feed-forward circuitry of the output stage into a low-distortion operating state. This can be done through several different methods, each of which has its own particular circuit requirements. For example, in one embodiment the bias circuitry generates a near constant bias current suitable for forcing the feed-forward circuitry into a low-distortion operating state regardless of the output stage output value.

One output stage of the present invention includes a buffer output circuit, a feed-forward control circuit, and a bias circuit. The buffer output circuit has a signal input, a non-buffered signal output and a buffered signal output. The feed-forward control circuit has a control input and a control output. The control input is coupled to the non-buffered signal output of the buffer output circuit, and the control output is coupled to the buffered signal output of the buffer output circuit. The bias circuit has a bias output coupled to the control input of the feed-forward control circuit.

BRIEF DESCRIPTION OF THE DRAWINGS

Prior Art

Prior Art

Prior Art

Prior Art

BEST MODES FOR CARRYING OUT THE INVENTION

FIGS. 1–4 illustrate Prior Art output circuitry.

Figure 1:
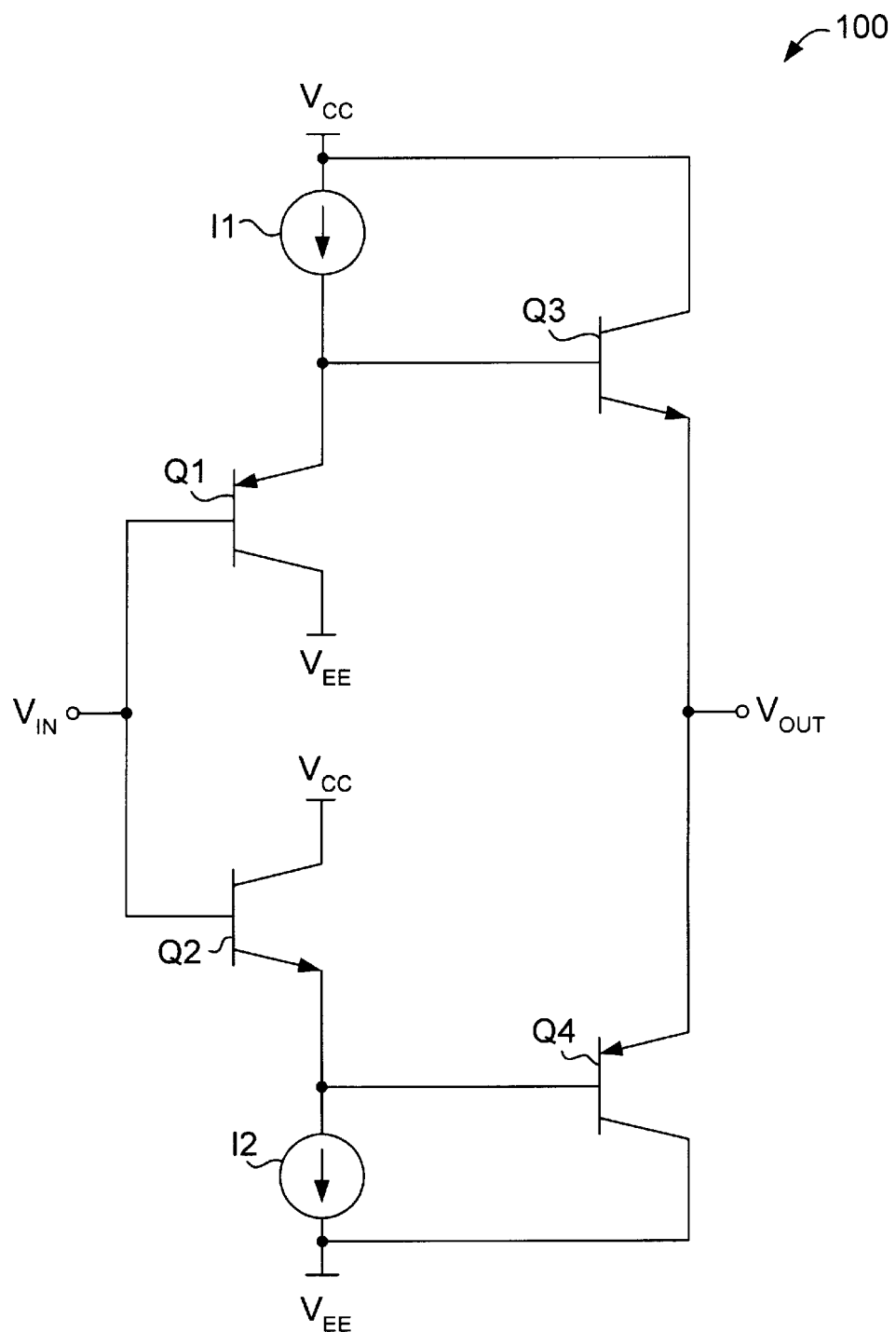
FIG. 1 is a schematic illustrating a 4-transistor emitter follower.
Figure 2:
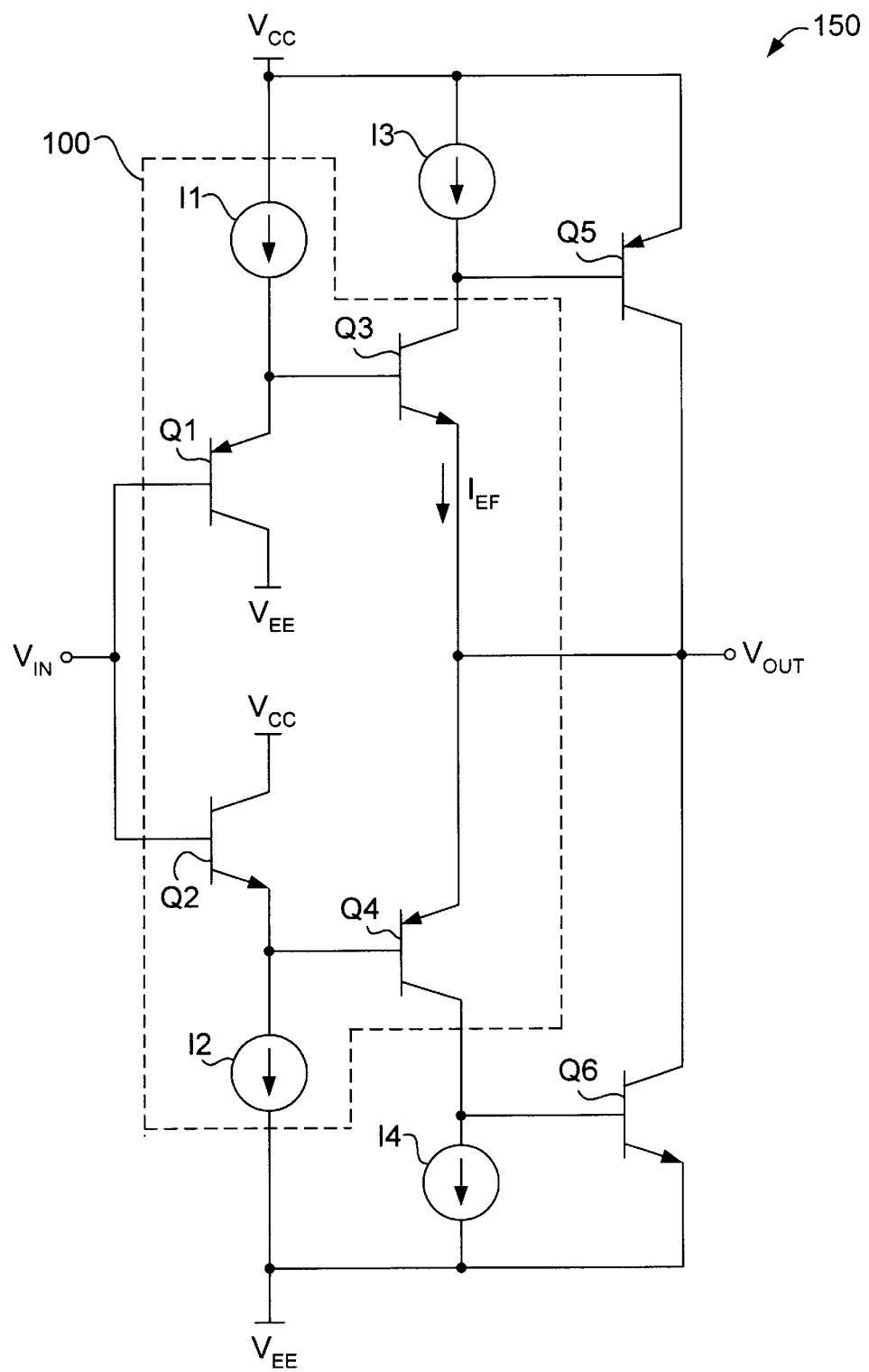
FIG. 2 is a schematic illustrating one class-AB output stage that is a common variation upon the emitter follower of Prior Art FIG. 1.
Figure 3:
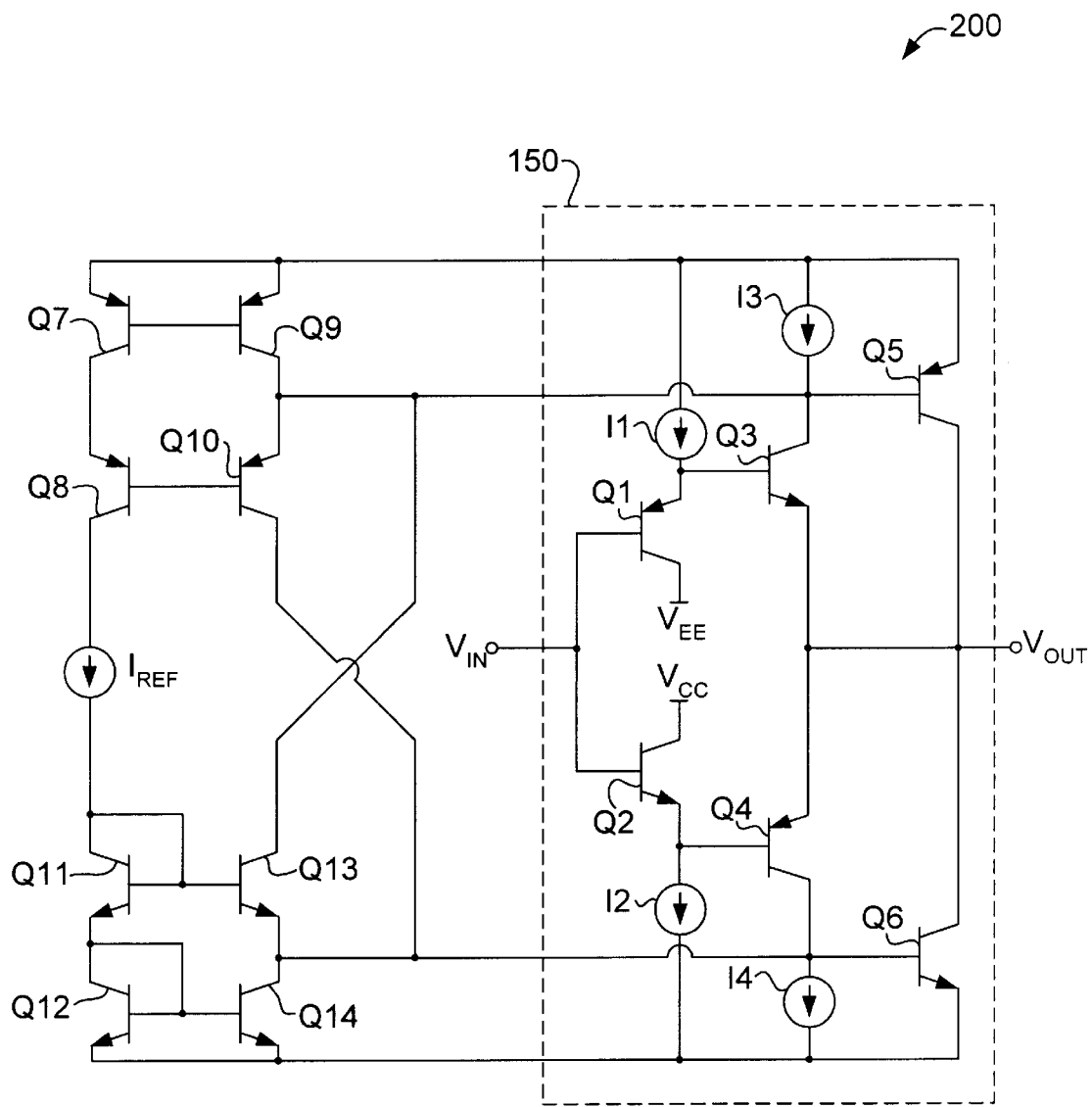
FIG. 3 is a schematic illustrating an output circuit that provides control of the common emitter output devices in a manner that does not limit the signal current gain.
Figure 4:
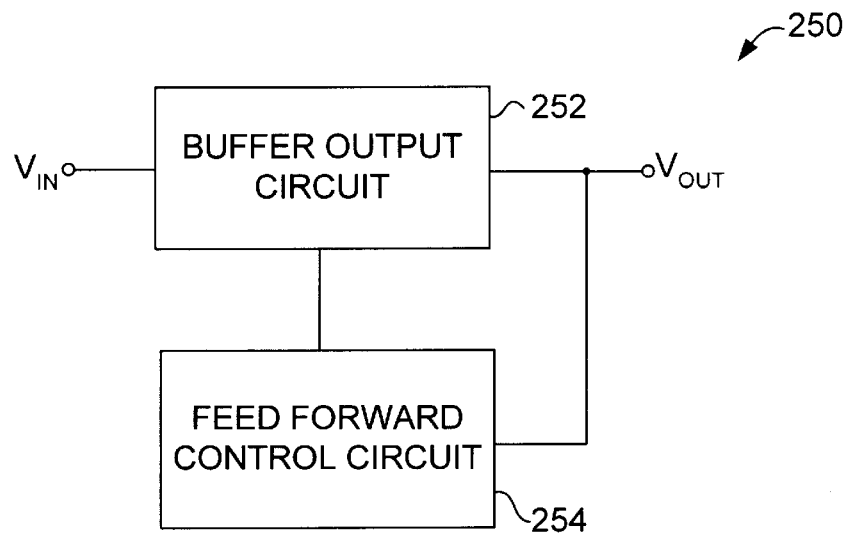
FIG. 4 is a block diagram showing an output circuit with a buffer output circuit and a feed-forward control circuit.
Figure 5:
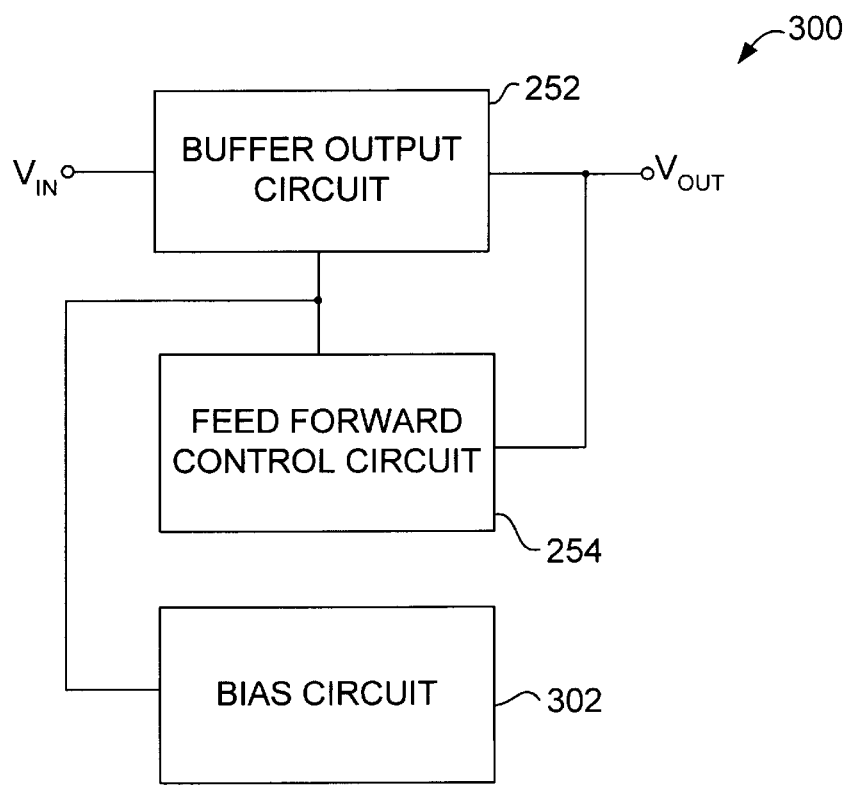
FIG. 5 a block diagram showing an output circuit in accordance with one embodiment of the present invention, the output circuit having a buffer output circuit, a feed-forward control circuit, and a bias circuit.

FIG. 5 illustrates a reduced distortion output circuit 300 in accordance with one embodiment of the present invention. The output circuit 300 provides a high output current with certain distortion characteristics superior to those of the circuitry illustrated in FIGS. 1–4. In addition to other applications, this embodiment is well suited for application as a class-AB output stage within an operational amplifier.

The output circuit 300 includes a buffer output circuit 252, a feedforward control circuit 254, and a bias circuit 302. The buffer output circuit 252 can take on a variety of forms, defined by the function of buffering or isolating the input signal applied at an input Vin from an output signal generated at an output Vout by the output circuit 300. For example, the emitter follower 100 is a suitable design for the buffer output circuit. The buffer output circuit 252 may power amplify the input signal. Alternatively, the buffer output circuit 252 may have a gain of unity, intended solely to isolate the input signal.

The feed-forward control circuit 254 provides parallel feed-forward current at the output Vout. The purpose of the feed-forward control circuit 254 is to compensate for any lack of supply current provided by the buffer output circuit 252. As noted in the above Background of the Invention section, Prior Art feed-forward control circuits provide high output current but suffer distortion effects due to modulation of transistors within the feed-forward control circuit. In order to decrease distortion, the bias circuit 302 drives the input of the feed-forward control circuit 254 in order to prevent distortion causing modulation of transistors found in the feed-forward control circuit 254. A variety of bias circuits 302 are contemplated by the present invention. In function, the bias circuit 302 may simply provide a constant bias current source biasing the feed-forward control circuit 254 into a fixed control position. One specific example of such a bias circuit 302 is described below with reference to FIG. 7. Alternatively, in function the bias circuit 302 may implement a feedback algorithm to more precisely control the amount of feed-forward output current while still addressing the distortion causing transistor modulation.

Figure 6:
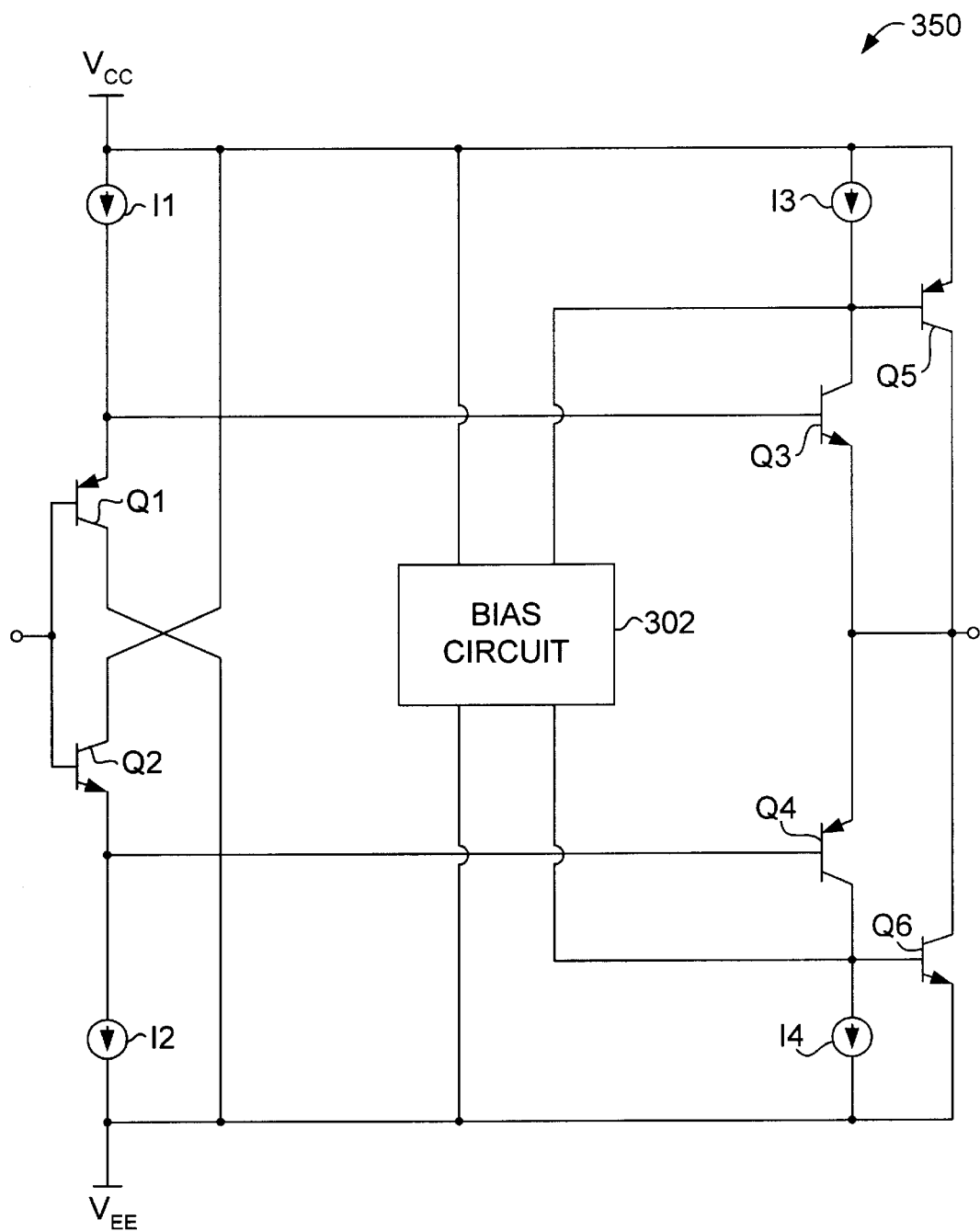
FIG. 6 is a schematic illustrating a reduced distortion output circuit in accordance with another embodiment of the present invention, this particular reduced distortion output circuit including a class-AB output stage and a bias circuit.

The schematic of FIG. 6 illustrates a reduced distortion output circuit 350 in accordance with another embodiment of the present invention. The output circuit 350 includes a class-AB output stage 150 and a bias circuit 302. As described above, the class-AB output stage 150 in theory works well, but suffers from a lack of control over the quiescent current of the feed-forward transistor devices Q5 and Q6. The bias circuit 302 operates to control the maintain quiescent current through the transistor devices Q5 and Q6 in order to provide high output current in a low distortion manner. As mentioned with reference to FIG. 5, the bias circuit 302 may simply provide a fixed bias current or alternatively may provide a variable bias current according to the current demand.

Figure 7:
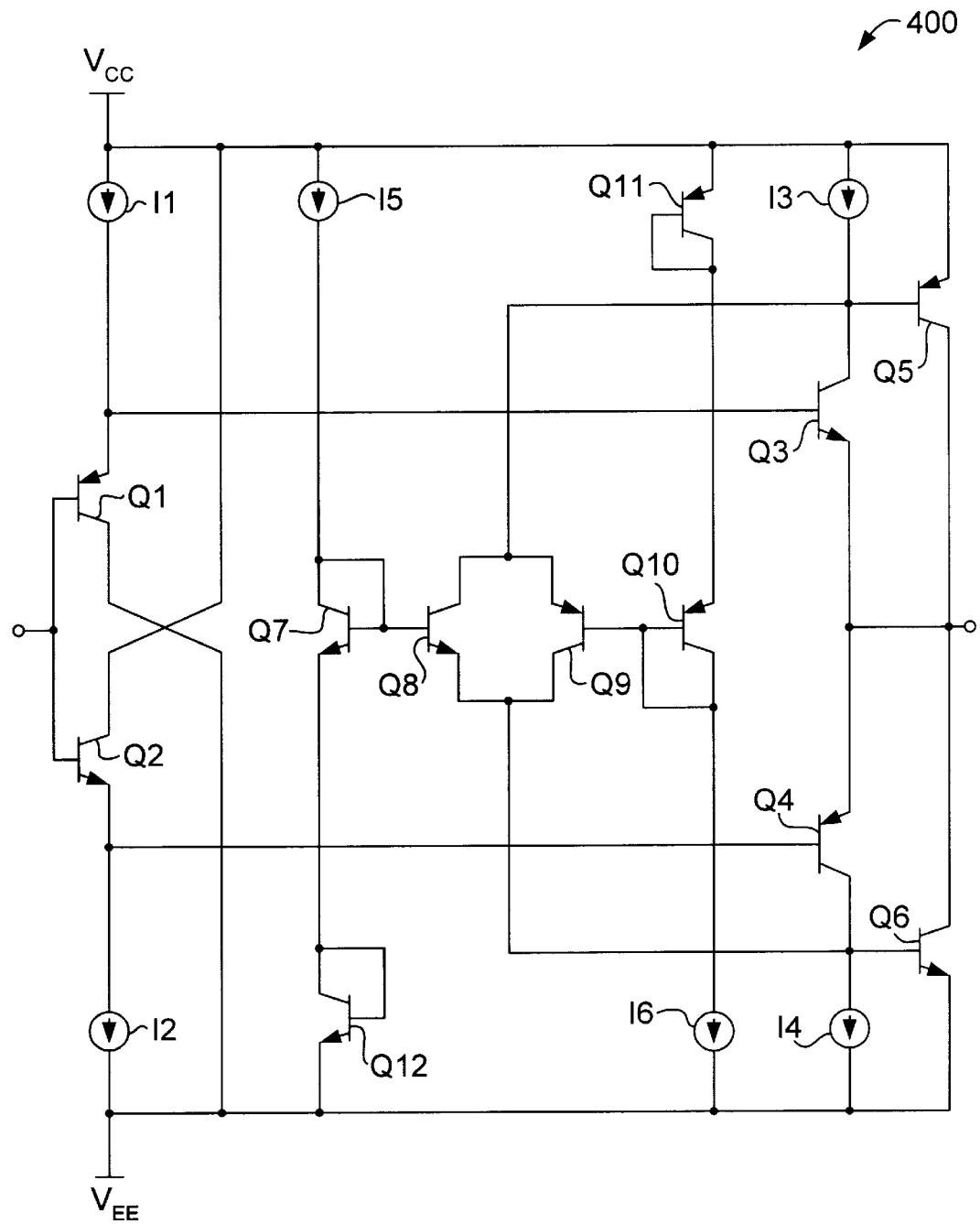
FIG. 7 is a schematic illustrating another output circuit 400 of the present invention.

The schematic of FIG. 7 illustrates one particular output circuit 400 of the present invention. As in FIG. 6, the output circuit 400 includes a class-AB buffer amplifier and a bias circuit 302. The bias circuit 302 provides a constant bias current to the input of the feed-forward current devices Q5 and Q6. The bias circuit 302 includes source and sink current devices 15 and 16, constant current transistors Q7 and Q10 coupled within current mirrors formed with devices Q8 and Q9, and diode connected transistors Q11 and Q12.

Consider a positive signal applied to the input at VIN that results in sourcing output current to a load connected to VOUT. As load current begins to flow, the current through Q3 increases while current through Q4 decreases. The increasing current entering the collector of Q3 decreases the potential at the base of Q5 resulting in increased Q5 current which adds to the total current sourced to the load. The decreasing potential at the base of Q5 results in decreasing the current through Q9 corresponding to the decrease in current through Q4.

Although only a few embodiments of the present invention have been described in detail herein, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

I claim:

1. An output stage with improved distortion performance, the output stage comprising:
   a buffer output circuit having a signal input, a non-buffered signal output and a buffered signal output;
   a feed-forward control circuit having a control input and a control output, the control input coupled to the non-buffered signal output of the buffer output circuit, and the control output coupled to the buffered signal output of the buffer output circuit; and
   a bias circuit having a bias output coupled to the control input of the feed-forward control circuit wherein a signal generated at said bias output is operable to constantly bias said feed-forward control circuit into a low-distortion operating state regardless of a value of said buffered signal output.

2. An output stage as recited in claim 1 wherein the buffer output circuit includes a complementary 4-transistor emitter follower having an output.

3. An output stage as recited in claim 2 wherein the feed-forward control circuit includes first and second complementary common emitter devices.

4. An output stage as recited in claim 3 wherein the output of the complementary 4-transistor emitter follower is coupled in parallel with the first and second complementary common emitter devices.

5. An output stage as recited in claim 4 wherein the bias circuit includes a controllable bias power source, the bias power source generating a bias signal at the bias circuit bias output.

6. An output stage as recited in claim 5 wherein the bias power source includes two parallel coupled current mirrors.

7. An output stage as recited in claim 5 wherein the bias signal operates to electrically bias the feed-forward control circuit towards a control position that experiences less distortion than a non-biased control position.

8. An output stage as recited in claim 1 wherein the bias circuit includes a controllable bias power source, the bias power source generating a bias signal at the bias circuit bias output.

9. An output stage as recited in claim 8 wherein the bias power source includes two parallel coupled current mirrors.

10. An output stage as recited in claim 8 wherein the bias signal operates to electrically bias the feed-forward control circuit towards a control position that experiences less distortion than a non-biased control position.

11. An output stage with certain distortion performance characteristics, the output stage comprising:
    a buffer output circuit formed with a signal input, a non-buffered signal output and a buffered signal output, the buffer output circuit including a complementary 4-transistor emitter follower having an output;
    a feed-forward control circuit formed with a control input and a control output, the control input coupled to the non-buffered signal output of the buffer output circuit, and the control output coupled to the buffered signal output of the buffer output circuit, the feed-forward control circuit including first and second complementary common emitter devices; and
    a bias circuit formed with a bias output coupled to the control input of the feed-forward control circuit, the bias output including a controllable bias power source, the bias power source generating a bias signal at the bias circuit bias output said bias signal operable to constantly bias said feed-forward control circuit into a low-distortion operating state regardless of a value of said buffered signal output.

12. An output stage as recited in claim 11, wherein the buffer output circuit further includes a pair of near perfect current sources providing a power supply.

13. An output stage as recited in claim 11 wherein the buffer output circuit is a class-AB type output stage.

14. An output stage as recited in claim 13 wherein the feed-forward control circuit includes a pair of common emitter transistor devices driven by a pair of source and sink current devices.

15. An output stage as recited in claim 11 wherein the feed-forward control circuit includes a pair of common emitter transistor devices driven by a pair of source and sink current devices.

16. An output stage as recited in claim 15 wherein the feed-forward control circuit includes two parallel connected driver transistors and a complementary pair of constant current transistors, the complementary pair of constant current transistors being operated as current mirrors together with four helper transistors.

17. An output stage with certain distortion performance characteristics, the output stage comprising:
    a buffer output circuit formed with a signal input, a non-buffered signal output and a buffered signal output, the buffer output circuit including a complimentary 4-transistor emitter follower having an output;
    a feed-forward control circuit formed with a control input and a control output, the control input coupled to the non-buffered signal output of the buffer output circuit, and the control output coupled to the buffered signal output of the buffer output circuit, the feed-forward control circuit including first and second complimentary common emitter devices; and
    a bias circuit formed with a bias output coupled to the control input of the feed-forward control unit, the bias output including a controllable bias power source, the bias power source generating a bias signal at the bias circuit bias output.
    wherein the bias signal generated at the bias circuit bias output is a constant bias current forcing the feed-forward current devices into a certain minimum distortion state, and wherein the bias circuit includes source and sink current devices, constant current transistors coupled within current mirrors formed with two helper transistor devices, and two diode connected transistors.

18. A feed-forward control method for improving performance of a 4-transistor emitter follower comprising:
    providing a buffer output circuit having a signal input, a non-buffered signal output and a buffered signal output;
    providing a feed-forward control circuit having a control input and a control output, the control input coupled to the non-buffered signal output of the buffer output circuit, and the control output coupled to the buffered signal output of the buffer output circuit;
    providing a bias signal to said control input of said feed-forward control circuit, said bias signal operable to constantly bias said feed-forward circuit into a low-distortion operating state regardless of a value of said buffered signal output.

* * * * *